United States Patent
Lee

(10) Patent No.: US 9,201,093 B2
(45) Date of Patent: Dec. 1, 2015

(54) INSPECTION APPARATUS FOR SEMICONDUCTOR DEVICE

(75) Inventor: Chae-Yoon Lee, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 66 days.

(21) Appl. No.: 14/004,941

(22) PCT Filed: Sep. 16, 2011

(86) PCT No.: PCT/KR2011/006716
§ 371 (c)(1),
(2), (4) Date: Sep. 13, 2013

(87) PCT Pub. No.: WO2012/124867
PCT Pub. Date: Sep. 20, 2012

(65) Prior Publication Data
US 2014/0002123 A1 Jan. 2, 2014

(30) Foreign Application Priority Data

Mar. 14, 2011 (KR) .................. 10-2011-0022556
Sep. 9, 2011 (KR) .................. 10-2011-0091552

(51) Int. Cl.
*G01R 1/04* (2006.01)
*G01R 31/28* (2006.01)

(52) U.S. Cl.
CPC ............ *G01R 1/0441* (2013.01); *G01R 1/0466* (2013.01); *G01R 31/2893* (2013.01)

(58) Field of Classification Search
CPC .......... G01R 1/07342; G01R 1/06738; G01R 1/0466; G01R 1/0433; G01R 1/07314; G01R 1/0483; G01R 1/0416; G01R 1/0441
See application file for complete search history.

(56) References Cited

U.S. PATENT DOCUMENTS 3,361,961 A * 1/1968 Zoellick .................. 324/262
4,189,203 A * 2/1980 Miller ..................... 439/263

(Continued)

FOREIGN PATENT DOCUMENTS

JP 02-195280 8/1990
JP 07-201428 8/1995

(Continued)

OTHER PUBLICATIONS

International Search Report for International Application No. PCT/KR2011/006716, dated Apr. 24, 2012.

(Continued)

*Primary Examiner* — Jermele M Hollington
*Assistant Examiner* — Suresh K Rajaputra
(74) *Attorney, Agent, or Firm* — Kile Park Reed & Houtteman PLLC

(57) ABSTRACT

Disclosed is an inspection apparatus for a semiconductor device, which is to inspect an electric characteristic of an inspective object having a plurality of electric inspective contact points. The inspection apparatus includes a socket assembly which includes a plurality of probe pins retractable in a longitudinal direction, a probe pin supporter supporting the probe pins in parallel with each other, and a socket board including a plurality of fixed contact points a first end portion of the probe pins, and an inspective object carrier which includes an inspective object accommodating portion accommodating the inspective object so that the inspective contact points face toward a second end portion of the probe pins, and a floor member interposed between the inspective object and the probe pin supporter and including probe holes penetrated corresponding to the inspective contact points and passing the second end portion of the probe pin therethrough.

10 Claims, 11 Drawing Sheets

(56) References Cited

U.S. PATENT DOCUMENTS

| | | | |
|---|---|---|---|
| 5,084,671 A * | 1/1992 | Miyata et al. | 324/750.09 |
| 5,090,259 A * | 2/1992 | Shishido et al. | 73/866.5 |
| 5,198,752 A * | 3/1993 | Miyata et al. | 324/750.08 |
| 5,208,529 A * | 5/1993 | Tsurishima et al. | 324/750.16 |
| 5,635,832 A * | 6/1997 | Ito et al. | 324/756.02 |
| 5,708,222 A * | 1/1998 | Yonezawa et al. | 73/865.8 |
| 5,805,472 A * | 9/1998 | Fukasawa | 702/118 |
| 5,969,530 A * | 10/1999 | Yamashita | 324/537 |
| 6,005,405 A * | 12/1999 | Slutz | 324/754.08 |
| 6,246,249 B1 * | 6/2001 | Fukasawa et al. | 324/756.02 |
| 6,469,496 B1 * | 10/2002 | Khouw et al. | 324/750.25 |
| 6,534,856 B1 * | 3/2003 | Dozier et al. | 257/698 |
| 6,627,483 B2 * | 9/2003 | Ondricek et al. | 438/117 |
| 6,791,171 B2 * | 9/2004 | Mok et al. | 257/678 |
| 6,856,154 B2 * | 2/2005 | Song et al. | 324/750.02 |
| 6,932,635 B2 * | 8/2005 | Ishikawa et al. | 439/190 |
| 6,956,390 B1 * | 10/2005 | Feltner et al. | 324/750.03 |
| 7,202,677 B2 * | 4/2007 | Pedersen et al. | 324/756.02 |
| 7,202,685 B1 * | 4/2007 | Bartley et al. | 324/750.09 |
| 7,268,534 B2 * | 9/2007 | Kim | 324/757.04 |
| 7,349,223 B2 * | 3/2008 | Haemer et al. | 361/767 |
| 7,356,742 B2 * | 4/2008 | Aoki et al. | 714/719 |
| 7,367,813 B2 * | 5/2008 | Matsuo | 439/66 |
| 7,382,142 B2 * | 6/2008 | Chong et al. | 324/750.25 |
| 7,479,795 B2 * | 1/2009 | Hayashi et al. | 324/750.09 |
| 7,528,617 B2 * | 5/2009 | Cojocneanu et al. | 324/756.07 |
| 7,621,761 B2 * | 11/2009 | Mok et al. | 439/81 |
| 7,629,806 B2 * | 12/2009 | Hosaka | 324/755.06 |
| 7,676,908 B2 * | 3/2010 | Hayama et al. | 29/748 |
| 7,919,974 B2 * | 4/2011 | Yamashita et al. | 324/757.01 |
| 8,087,955 B2 * | 1/2012 | Kazama et al. | 439/607.03 |
| 8,096,840 B2 * | 1/2012 | Hironaka et al. | 439/750 |
| 8,120,372 B2 * | 2/2012 | Takekoshi | 324/750.21 |
| 8,164,355 B2 * | 4/2012 | Yamashita | 324/757.01 |
| 8,587,946 B2 * | 11/2013 | Lee et al. | 361/713 |
| 8,659,311 B2 * | 2/2014 | Sakata et al. | 324/754.11 |
| 8,766,658 B2 * | 7/2014 | Komatsu | 324/754.14 |
| 8,779,791 B2 * | 7/2014 | Umemura et al. | 324/755.04 |
| 8,922,232 B2 * | 12/2014 | Matsumura et al. | 324/755.07 |
| 2001/0019276 A1 * | 9/2001 | Yoshida et al. | 324/754 |
| 2001/0027053 A1 * | 10/2001 | Hasegawa | 439/482 |
| 2002/0074653 A1 * | 6/2002 | Khandros et al. | 257/724 |
| 2002/0195265 A1 * | 12/2002 | Miller et al. | 174/70 R |
| 2004/0077200 A1 * | 4/2004 | Ishikawa et al. | 439/190 |
| 2004/0152347 A1 * | 8/2004 | Oh et al. | 439/70 |
| 2005/0035311 A1 * | 2/2005 | Asakawa et al. | 250/559.16 |
| 2005/0202716 A1 * | 9/2005 | Saito | 439/527 |
| 2006/0087331 A1 * | 4/2006 | Young et al. | 324/754 |
| 2006/0139042 A1 * | 6/2006 | Kasukabe | 324/754 |
| 2006/0186905 A1 * | 8/2006 | Kohashi et al. | 324/754 |
| 2007/0007984 A1 * | 1/2007 | Kojima et al. | 324/765 |
| 2007/0099446 A1 * | 5/2007 | Hasegawa | 439/71 |
| 2007/0279074 A1 * | 12/2007 | Kasukabe et al. | 324/754 |
| 2007/0296419 A1 * | 12/2007 | Aizawa et al. | 324/537 |
| 2008/0048158 A1 * | 2/2008 | Hayama et al. | 254/1 |
| 2008/0054434 A1 * | 3/2008 | Kim | 257/686 |
| 2008/0186015 A1 * | 8/2008 | Osakabe | 324/158.1 |
| 2009/0017703 A1 * | 1/2009 | Takahashi et al. | 439/824 |
| 2009/0212798 A1 * | 8/2009 | Kasukabe et al. | 324/754 |
| 2010/0019791 A1 * | 1/2010 | Yamashita | 324/757 |
| 2010/0231251 A1 * | 9/2010 | Nelson et al. | 324/761 |
| 2010/0301889 A1 * | 12/2010 | Sakata et al. | 324/756.07 |
| 2011/0050264 A1 * | 3/2011 | Kurosawa | 324/756.02 |
| 2014/0002123 A1 * | 1/2014 | Lee | 324/756.02 |

FOREIGN PATENT DOCUMENTS

| | | |
|---|---|---|
| JP | 2001-159655 | 6/2001 |
| JP | 2005-257646 | 9/2005 |
| JP | 2006-208356 | 8/2006 |
| KR | 10-2006-0035074 | 4/2006 |
| KR | 10-2006-0040822 | 5/2006 |

OTHER PUBLICATIONS

Office Action of Japanese Patent Application No. 2013-558772, dated May 13, 2015.

* cited by examiner

INSPECTION APPARATUS FOR SEMICONDUCTOR DEVICE

FIELD OF THE INVENTION

The present invention relates to an inspection apparatus for a semiconductor device, and more particularly to an inspection apparatus for a semiconductor device, in which a contact tolerance between a probe pin and an inspection contact point of the semiconductor device is reduced when the electric characteristic of the semiconductor device is inspected.

BACKGROUND ART

In general, a semiconductor device such as an integrated chip (IC) has been tested with regard to its defects by inspecting the electric characteristic of the semiconductor device during a manufacturing process. The electric characteristic of the semiconductor device is inspected through a probe pin interposed between the inspection contact point (bump) of the semiconductor device and a contact point (pad) of a test board including a printed circuit board (PCB). Also, the electric characteristic of the semiconductor device is inspected while the semiconductor device is being inserted in an inspective object carrier.

FIG. 17 is a view showing a structure of a conventional inspection device for a semiconductor device. An inspection apparatus 1 for the semiconductor device includes an inspective object carrier 30 on which a semiconductor device 10 is seated, a pusher 20 placed above the inspective object carrier 30 and pushing the seated semiconductor device 10 downward for the test, a socket guide 40 placed below the inspective object carrier 30, and a socket assembly 60 having a probe pin 50 to contact the inspection contact point of the seated semiconductor device.

Conventional inspection for the semiconductor device 10 has been performed by electric contact between a ball terminal 10a of the semiconductor device 10 mounted to the inspective object carrier 30 and the probe pin 50 supported in the socket assembly 60. At this time, a very small ball terminal 10a and the probe pin 50 are arranged at a narrow pitch, and therefore alignment of very high precision is required during the test. The alignment between the ball terminal 10a and the probe pin 50 is achieved by alignment between aligning holes 32 of the inspective object carrier 30 and aligning pins 42 of the socket guide 40.

The inspective object carrier 30 alternates between coupling with and separating from the socket guide 40 during the test, and therefore a margin between the aligning pin 42 and the aligning hole increases by repetitive coupling and separating. In result, the increase in such a margin causes a problem of mismatching between the ball terminal 10a and the probe pin 50. Also, a tolerance may be additionally caused when the socket assembly 60 is mounted to the socket guide 40.

DISCLOSURE OF INVENTION

An aspect of the invention is to provide an inspection apparatus for a semiconductor device, which can improve precision in contact between a probe pin and an inspection contact point of an inspective object during a test.

Another aspect of the invention is to provide an inspection apparatus for a semiconductor device, which can reduce contact resistance between a probe pin and an inspection contact point of an inspective object Still another aspect of the invention is to provide an inspection apparatus for a semiconductor device, which can reduce contamination in a contact end portion of the probe pin when the inspective object is inspected.

Yet another aspect of the invention is to provide an inspection apparatus for a semiconductor device, which can prevent a guide projection of a socket assembly and a guide groove of a floor member of an inspective object carrier from being jammed when they are matched with each other.

The foregoing and/or other aspects of the present invention are achieved by providing an inspection apparatus for a semiconductor device, which is to inspect an electric characteristic of an inspective object having a plurality of electric inspective contact points, the inspection apparatus including: a socket assembly which includes a plurality of probe pins retractable in a longitudinal direction, a probe pin supporter supporting the probe pins in parallel with each other, and a socket board including a plurality of fixed contact points a first end portion of the probe pins; and an inspective object carrier which includes an inspective object accommodating portion accommodating the inspective object so that the inspective contact points face toward a second end portion of the probe pins, and a floor member interposed between the inspective object and the probe pin supporter and including probe holes penetrated corresponding to the inspective contact points and passing the second end portion of the probe pin therethrough.

The floor member and the probe pin supporter may include an embossed coupling portion which includes a guide projection at one side and a guide groove at the other side to be coupled and aligned along a longitudinal direction of the probe pin.

The embossed coupling portion may be formed so that coupling between the guide projection and the guide groove is prior to coupling between the probe pin and the probe hole when the probe pin supporter approaches the floor member.

The protrusion may be not in contact with the protrusion accommodating portion, when the guide projection and the guide groove are coupled.

The embossed coupling portion may include at least two pairs of one side guide projections and the other side guide grooves, and the at least two pairs of guide projection and guide groove are different in shape not to be jammed each other.

The different shapes may include a circular shape and an elliptical shape.

The floor member may include a dust discharging opening.

EFFECTS OF THE INVENTION

According to the present invention, contact between an inspection contact point of an inspective object and a probe pin is achieved in a probe hole of a floor member, thereby not only improving precision in the contact but also reducing contact resistance.

According to the present invention, a center portion of an inspective object carrier is blocked by the floor member, thereby having an effect on preventing a lower tip portion of the probe pin from being stained with foreign materials.

According to the present invention, a changed contact position of the socket is corrected to prevent the probe pin from being dislocated, and the exact contact with the center of the inspection contact point of the inspective object protect the probe pin and the inspective contact from an external shock of the socket to thereby have an effect on extending a lifespan.

According to the present invention, it is advantageous that the inspective object does not fall from the inspective object carrier even though vibration is generated while the inspection object is inserted in the inspective object carrier for the electric characteristic inspection.

MODES FOR CARRYING OUT THE INVENTION

Figure 1:
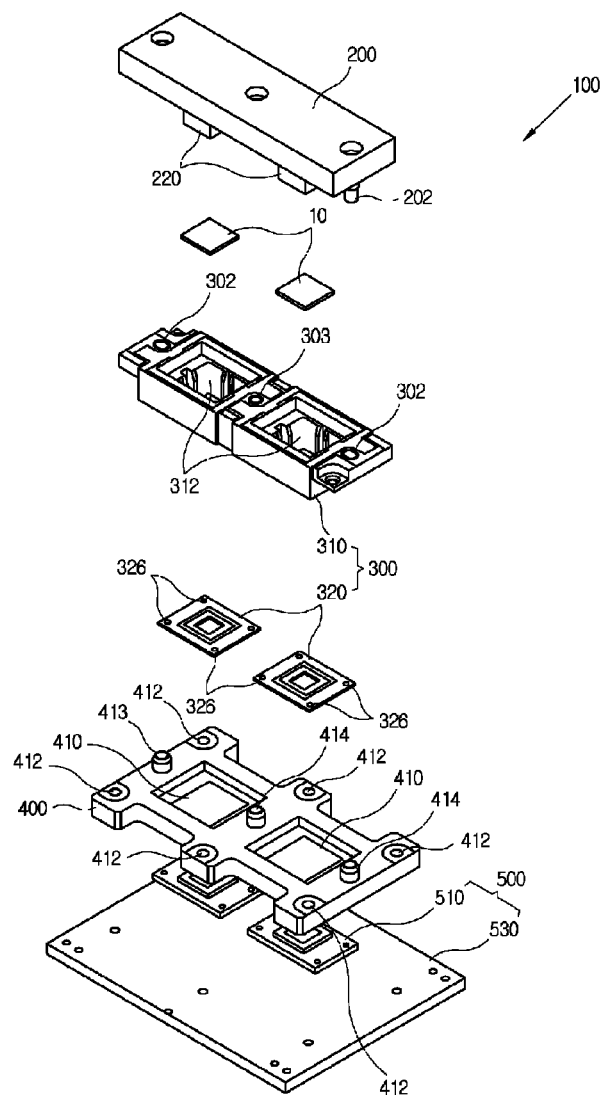
FIG. 1 is an exploded perspective view of an inspection apparatus for a semiconductor device according to an embodiment.
Figure 2:
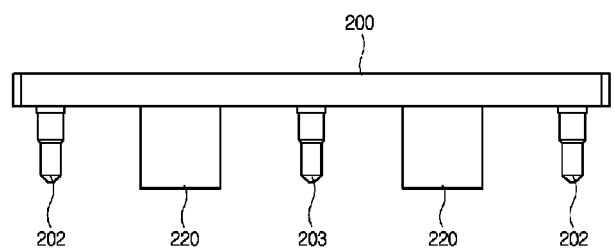
FIG. 2 is a cross-section view of a pusher 200 in the inspection apparatus for the semiconductor device of FIG. 1, FIGS. 3 to 5 are respectively a plan view, a cross-section view and a bottom view showing the inspective object carrier 300 in the inspection apparatus for the semiconductor device of FIG. 1.

Hereinafter, exemplary embodiments of the present invention will be described in more detail with reference to accompanying drawings. For clear description, matters unrelated to the description will be omitted. Also, like numerals refer to the same or like elements throughout, and up, down, left and right directions are set up with respect to the front of the drawing.

As shown in FIG. 1, an inspection apparatus for a semiconductor device 100 according to an exemplary embodiment includes an inspective object carrier 300 for stably seating a semiconductor device 10 thereon, a pusher 200 placed above the inspective object carrier 300 and pushing the seated semiconductor device 10 during a test, a floor member 320 detachably supported on a floor of the inspective object carrier 300, a socket guide 400 placed below the inspective object carrier 300, and a socket assembly 500 coupling with the socket guide 400 and supporting a plurality of probe pins 522.

Figure 12:
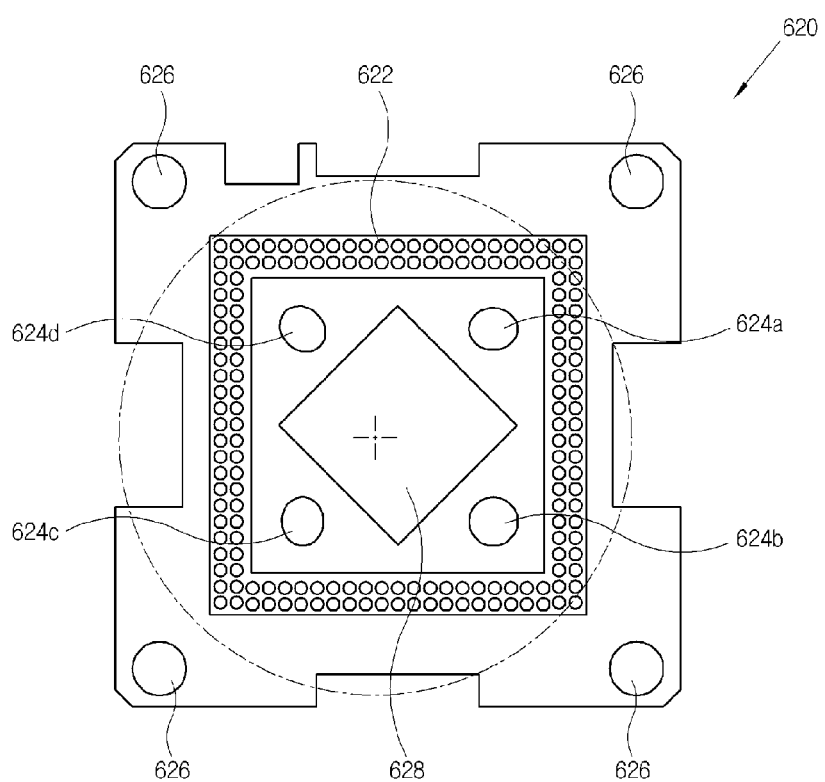
FIG. 12 is a plan view showing a floor member 620 in an inspection apparatus for a semiconductor device according to another embodiment.

As shown in FIG. 12, the pusher 200 includes a pressing projection 220 pressing the semiconductor device 10 seated on the inspective object carrier 300 downward, and a first aligning pin 202 inserted in a first aligning hole 302 formed in the inspective object carrier 300 (to be described later) so as to exactly press the semiconductor device 10.

Figure 3:
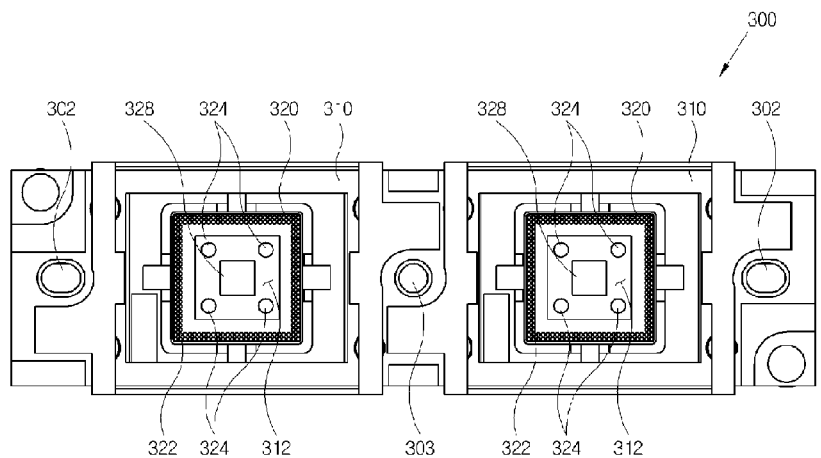
Figure 4:
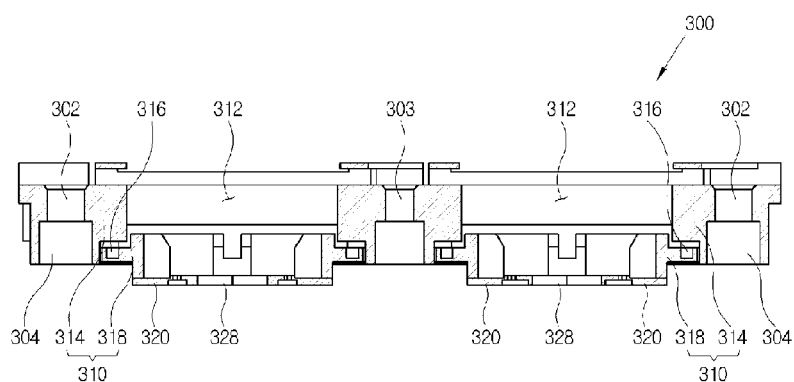
Figure 5:
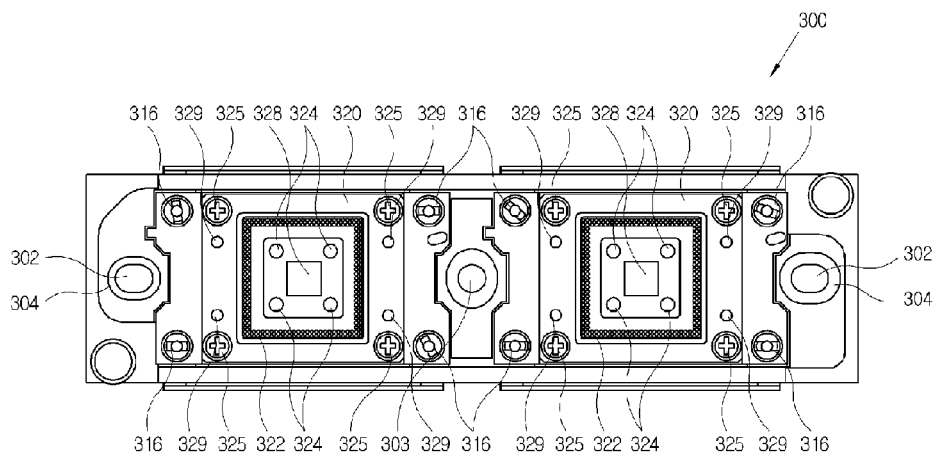

As shown in FIGS. 3 to 5, the inspective object carrier 300 includes an inspective object accommodating portion 310 centrally having an opening 312 to accommodate the semiconductor device 10, and a floor member 320 detachably supported on the floor of the inspective object accommodating portion 310. For example, the floor member 320 may be detachably coupled to the inspective object accommodating portion 310 by a screw 325.

The inspective object carrier 300 includes first aligning holes 302, 303 in which the first aligning pin 202 of the pusher 200 is inserted. Both left and right first aligning holes 302 have an elliptical shape, and a center first aligning hole 303 has a circular shape. The elliptical shape of both the left and right first aligning hole 302 is to reduce an aligning tolerance.

The inspective object accommodating portion 310 may include a base 314 centrally having the opening 312, and a floating member 318 mounted to the opening 312 of the base 314 and floatable by the elastic coupling portion 316 in up, down, left and right directions. Of course, the base 314 and the floating member 318 may be manufactured as a single body.

The inspective object carrier 300 may include a latch (not shown) arranged on an inner wall of the opening 312 in order to fasten and support the semiconductor device 10.

The inspective object 10 may include an integrated chip (IC) or the like semiconductor device, but not limited thereto. Alternatively, other devices may be applicable for inspect the electric characteristic.

Figure 6:
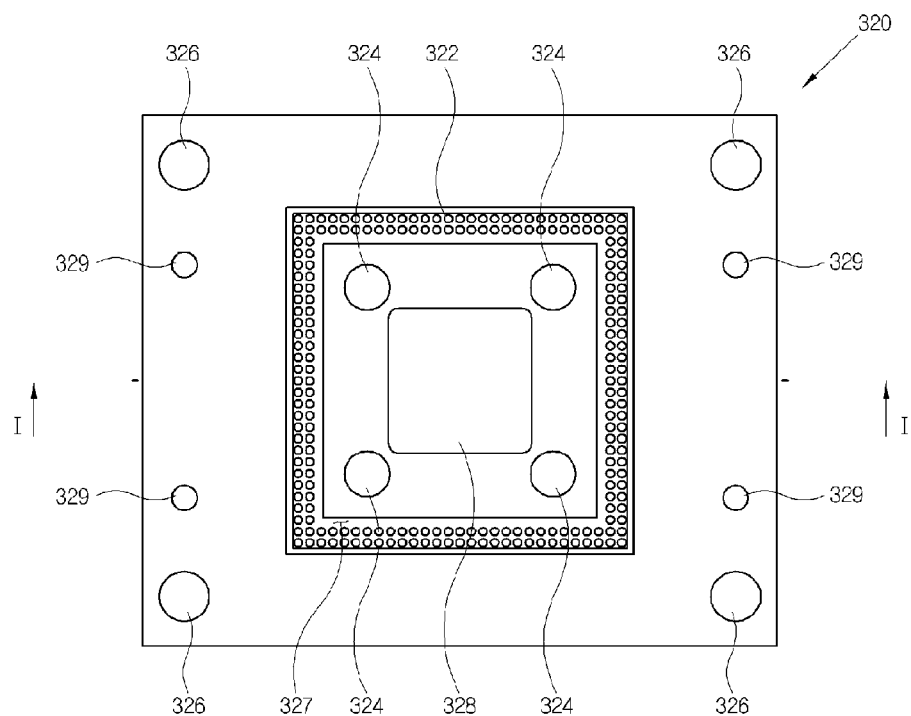
FIG. 6 is a plan view partially showing a floor member 320 of the inspective object carrier 300 in the inspection apparatus for the semiconductor device of FIG. 1.
Figure 7:
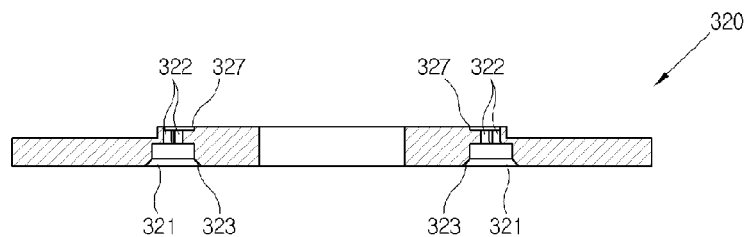
FIG. 7 is a cross-section view taken along line I-I of FIG. 6, FIGS. 8 and 9 are respectively a plan view and a cross-section view of a socket guide 400 in the inspection apparatus for the semiconductor device of FIG. 1, FIGS. 10 and 11 are respectively a perspective view and a partial cross-section view of a socket assembly 500 in the inspection apparatus for the semiconductor device of FIG. 1.

As shown in FIGS. 6 and 7, the floor member 320 includes a plurality of probe holes 322 positioned corresponding to the probe pin 522 of the socket assembly 500 (to be described later), a guide groove 324 circularly formed at a position corresponding to the guide projection 524 of the socket assembly 500, a screw hole 326 detachably fastening the floor member 320 to the inspective object accommodating portion 310, and a dust discharging opening 328 rectangularly opened at the center to discharge dust or the like contaminants during the test. The floor member 320 may include a second aligning hole 329 inserted in a second aligning pin (not shown) of the inspective object accommodating portion 310 so as to be exactly fastened to the floating member 318 of the inspective object accommodating portion 310.

The guide groove 324, together with the guide projection 524 of the socket assembly 500, forms an embossed coupling portion 324,524. The guide groove 324 may have an elliptical shape or various shapes besides a circular shape. The central dust discharging opening 328 may be formed in an outer portion in accordance with the shape of the semiconductor device 10, and may have a circular shape or various shapes besides a rectangular shape.

Figure 10:
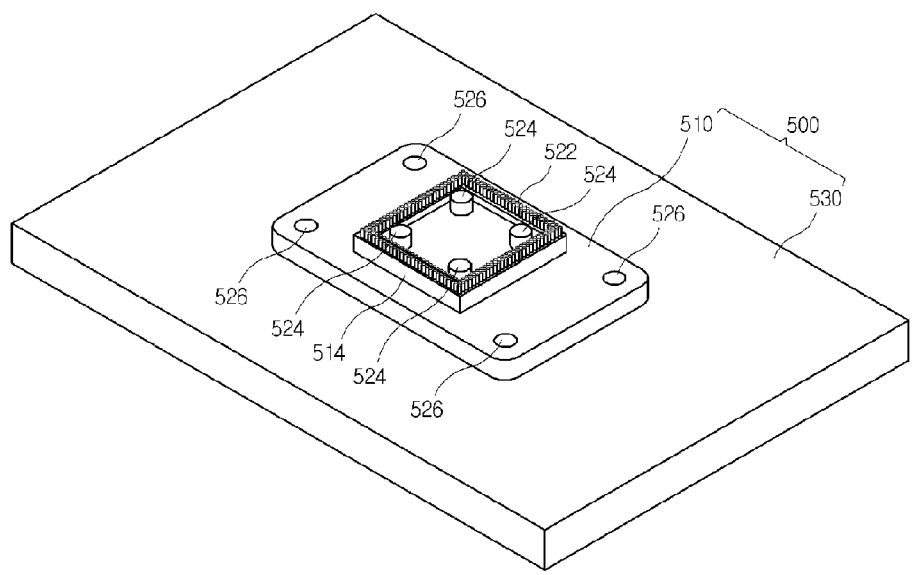

As shown in FIGS. 7 and 10, the floor member 320 is formed with a protrusion accommodating portion 321 on the bottom thereof to accommodate a protrusion 514 of the socket assembly 500 (to be described later). The protrusion accommodating portion 321 may include a tapered portion 323 from bottom to top so as to easily accommodate the protrusion 524.

The protrusion accommodating portion 321 is centrally formed with the probe hole 322.

The entrance of the probe hole 322 being in contact with the protrusion accommodating portion 321 may be tapered by rounding an edge so that the probe pin 522 can be safely inserted during the test. Also, the probe hole 322 includes a groove portion 327 on the top thereof on which a ball terminal 10a of the semiconductor device 10 is put.

Figure 8:
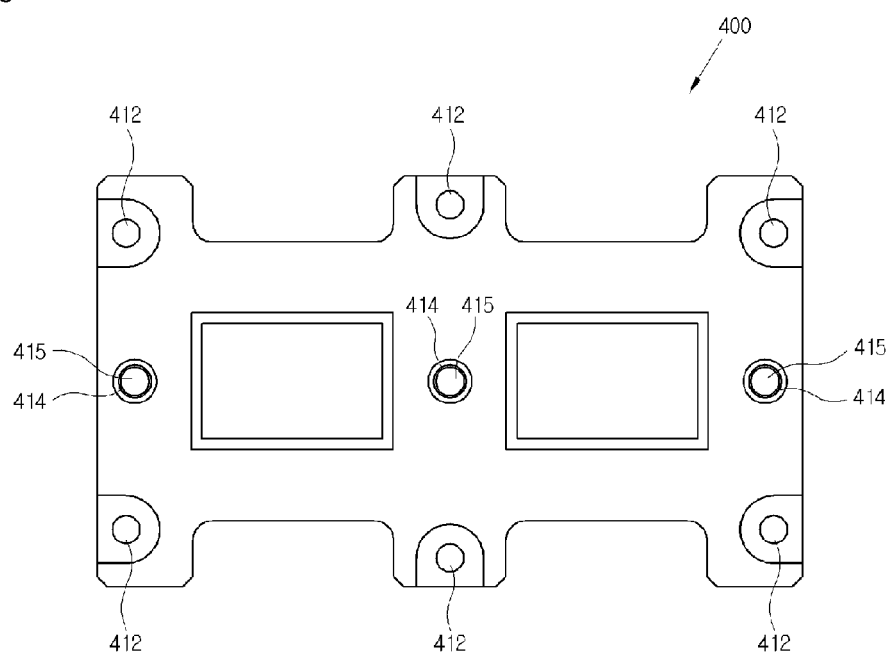
Figure 9:
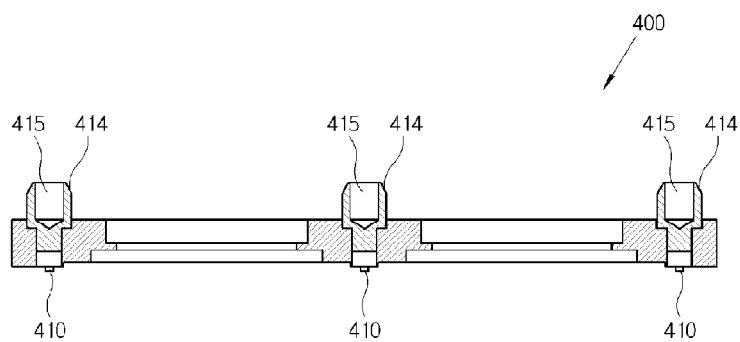

As shown in FIGS. 8 and 9, the socket guide 400 includes a coupling hole 412 to couple with the socket assembly 500 (to be described later), and a third aligning pin 414 having a hollow cylindrical shape and detachably coupling with the third aligning hole 304 of the inspective object carrier 300. The inner space of the third aligning pin 414 forms a fourth aligning hole 415 in which the first aligning pin 202 of the pusher 200 is inserted. During the test, the third aligning pin 414 of the socket guide 400 is inserted in the third aligning hole 304 of the inspective object carrier 300, and serves to primarily align the ball terminal 10a of the semiconductor device 10 with the probe pin 522. That is, the first aligning pin 202 of the pusher 200 penetrates the first aligning hole 302 of the inspective object carrier 300 and is inserted in the fourth aligning hole 415 as the inner space of the third aligning pin 414 of the socket guide 400 (to be described later) via the third aligning hole 304. The socket guide 400 may include a projection 416 protruding below the third aligning pin so as to couple with the socket board 530 to be described later.

Figure 11:
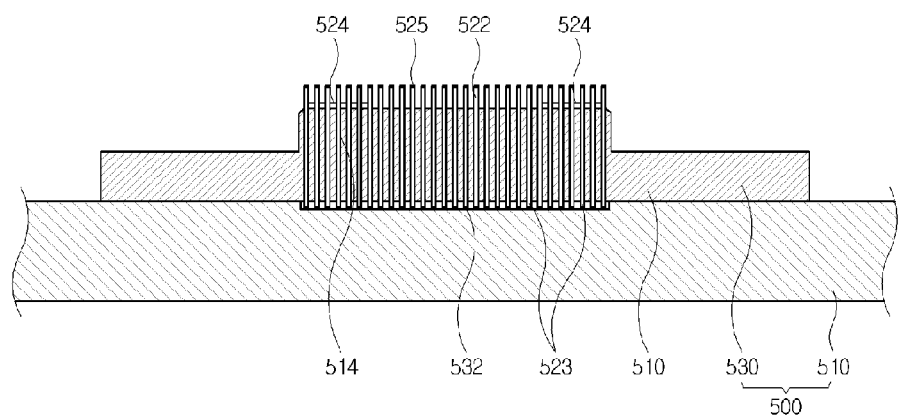

FIGS. 10 and 11 are views showing the socket assembly 500 according to an exemplary embodiment. The socket assembly 500 includes a probe pin supporter 510 supporting the plurality of probe pins 522, the guide projection 524 fitted into the guide groove 324 of the floor member 320, and a socket board 530 for mounting a probe pin supporter 510. As described above, the guide projection 524, together with the guide groove 324 of the floor member 320, forms the embossed coupling portion 324, 524. The probe pin supporter 510 may be coupled to the socket board 530 (to be described later).

As necessary, the embossed coupling portion 324, 524 may be provided by forming the guide projection 524 in the floor member 320 and forming the guide groove 324 in the probe pin supporter 510. In this embodiment, the embossed coupling portion 324, 524 includes four guide projection 524s arranged in the probe pin supporter 510, and four guide grooves 324 arranged in the floor member 320, but not limited thereto. Alternatively, three or less, or five or more projections and grooves may be arranged to have the same effect. Of course, if only one guide projection 524 and only one guide groove 324 are arranged, they have to be designed to have an elliptical, triangular, rectangular or the like shape with a predetermined size because there is no aligning effect when each cross-section of the guide projection 524 and the guide groove 324 has a circular shape.

The socket board 530 may include a printed circuit board (PCB) having a fixed contact point pad 532 and a circuit pattern (not shown) electrically connected to a tester (not shown). As shown in FIG. 11, a first end portion 523 of the probe pin 522 protrudes from the bottom of the probe pin supporter 510. This protruded first end portion 523 of the probe pin 522 is in contact with the fixed contact point pad 532 of the socket board 530 during the test.

The probe pin supporter 510 includes the protrusion 514, a part of which supported by the probe pin 522 protrudes. This protrusion 514 is arranged at a position corresponding to the protrusion accommodating portion 321 of the floor member 320, and accommodated in the protrusion accommodating portion 321 formed on the bottom of the floor member 320 of the inspective object carrier 300 during the test. A second end portion 525 of the probe pin 522 protrudes from the top of the protrusion accommodating portion 321. The second end portion 525 of the probe pin 522 is inserted in the probe hole 322 of the floor member 320 of the inspective object carrier during the test.

The probe pin 522 may be achieved by anything as long as it is retractable by an elastic body in a longitudinal direction. For example, a pogo pin may be used, in which the elastic body such as a spring is inserted in a hollow barrel, and upper and lower plungers are partially respectively projected from the barrel with the elastic body therebetween. In FIG. 8, both protruding end portions 523, 525 from the probe pin 522 are regarded as the upper and lower plungers.

FIG. 12 is a plan view showing a structure of a floor member 620 according to another exemplary embodiment. Here, the structure of the socket assembly corresponding to the floor member 620 is the same except the guide projection, and thus descriptions thereof are omitted for convenience. Of course, the shape of the guide projection has to correspond to the shapes of the guide groove 624a, 624b, 624c, 624d of the floor member 620 shown in FIG. 12, For example, if the guide groove has a circular shape, the corresponding guide projection has to have a pin shape having a circular cross-section. If the guide groove has an elliptical shape, the corresponding guide projection has to have a pin shape having an elliptical cross-section.

The floor member 620 includes a probe hole 622 positioned corresponding to the probe pin of the socket assembly, guide grooves 624a, 624b, 624c and 624d formed at positions corresponding to the guide projections of the socket assembly, a screw hole 626 detachably coupling the floor member 620 to the inspective object accommodating portion, and a dust discharging opening 628 rectangularly opened at the center thereof to discharge contaminants such as dust during the test. The floor member 620 may include a second aligning hole 629 inserted in a second aligning pin (not shown) of the inspective object accommodating portion so as to be exactly fixed to the inspective object accommodating portion.

The guide groove 624, together with the guide projection (not shown) of the socket assembly, forms the embossed coupling portion. As shown in FIG. 12, four guide grooves 624a, 624b, 624c and 624d of the floor member 320 may be different in shape from one another. In the floor member 320 shown in FIG. 6, all four guide grooves 324 have circular shape, but FIG. 12 shows that the elliptical guide grooves 624a, 624b, 624c and the circular guide groove 624d are mixed.

The reason why four guide grooves 624a, 624b, 624c, 624d are different in shape from one another is because four guide grooves 624a, 624b, 624c, 624d and four guide projections (not shown) of the socket assembly having the same cross-section as those are prevented from being jammed when they are coupled forming each pair. That is, if four pairs are all shaped like a circle and if there is a little tolerance, they may be too tightly or loosely coupled with each other, thereby damaging the probe pin or the ball terminal. However, if an elliptical shape different in direction is given, they are never matched with each other when there is a position tolerance, thereby causing no damage in the probe pin or the ball terminal.

The floor member 620 is centrally formed with a dust discharging opening 628 opened having a diamond shape.

Figure 13:
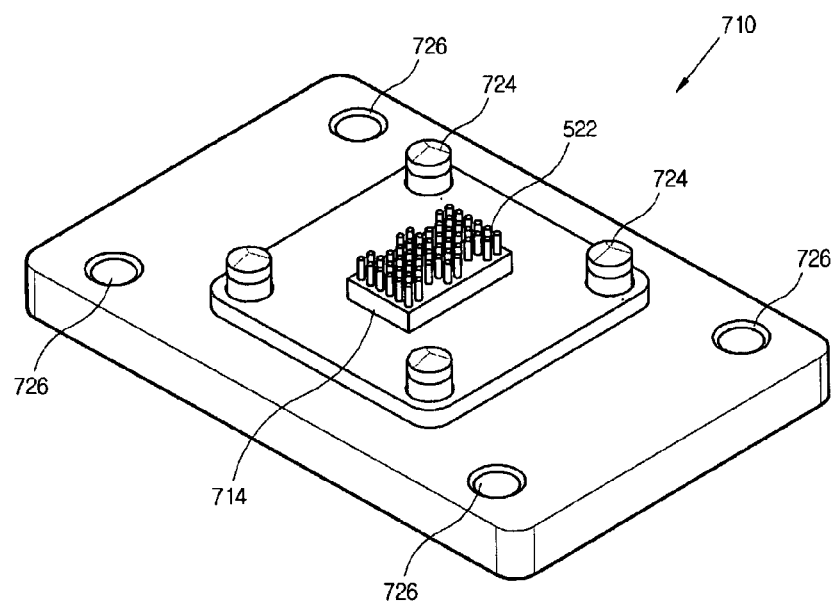
FIG. 13 is a perspective view showing a probe pin supporter 710 in an inspection apparatus for a semiconductor device according to another embodiment.

As shown in FIG. 13, a probe pin supporter 710 according to another exemplary embodiment is provided with a protrusion 714 that includes four guide projections 724 in the vicinity of four corners and a probe pin 522 protruding at the center thereof. Such a probe pin supporter 710 may be used when the ball terminal 10a of the semiconductor device 10 is arranged in the center.

Below, operations of the inspection apparatus 100 for the semiconductor device will be described with reference to FIGS. 14a to 16b.

FIGS. 14a to 16b show that the semiconductor device 10 is inspected as the socket assembly 500, the socket guide 400, the inspective object carrier 300 and the pusher 200 are sequentially aligned in an inspection apparatus for a semiconductor device.

Figure 14A:
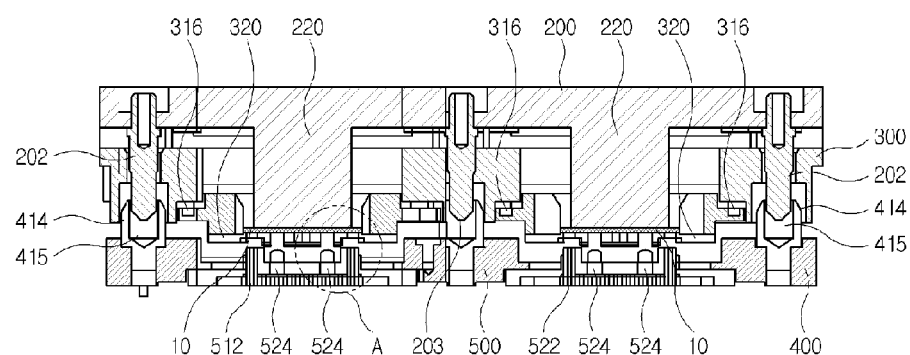
FIG. 14a is a cross-section view showing a state that the pusher 200, the inspective object carrier 300, the socket guide 400 and the socket assembly 500 are primarily aligned in the inspection apparatus for the semiconductor device of FIG. 1.
Figure 14B:
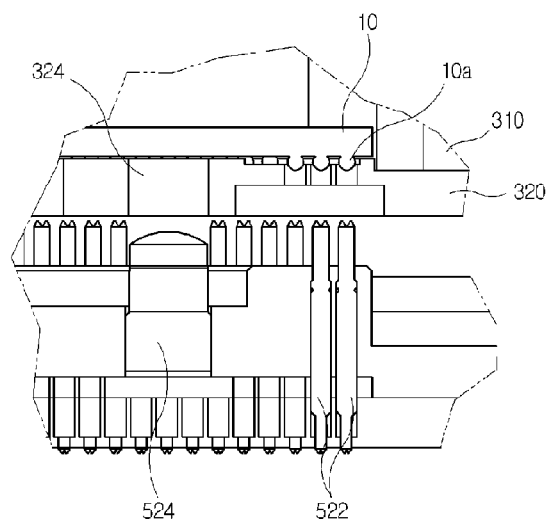
FIG. 14b is a partially enlarged cross-section view showing an 'A' part of FIG. 14a, FIG. 15a is a cross-section view showing a state that the pusher 200, the inspective object carrier 300, the socket guide 400 and the socket assembly 500 are secondarily aligned in the inspection apparatus for the semiconductor device of FIG. 1.

First, as shown in FIG. 14a, the first aligning pin 202 of the pusher 200 is sequentially inserted in the first aligning hole 302 and the third aligning hole 304 of the inspective object carrier, and the fourth aligning hole 415 of the socket guide 400. Consequently, the ball terminal 10a of the semiconductor device 10 seated on the inspective object carrier 300 and the probe pin 522 of the socket assembly 500 are primarily aligned. At this time, as shown in FIG. 14b, the guide projection 524 of the probe pin supporter 510 is not inserted into the guide groove 324 of the floor member 320 of the inspective object carrier 300.

Figure 15A:
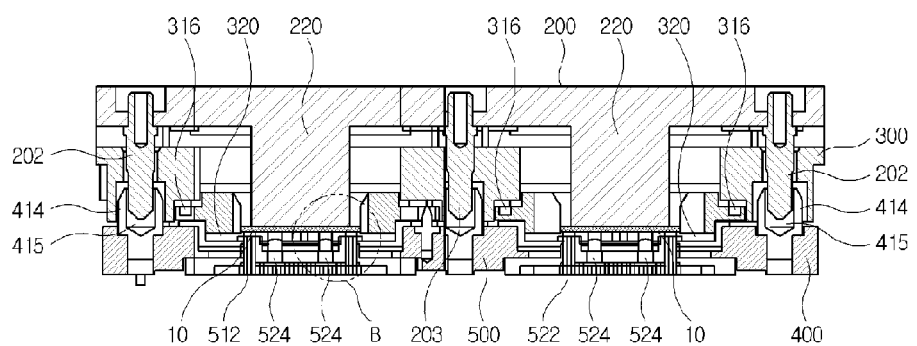
FIG. 15b is a partially enlarged cross-section view showing a 'B' part of FIG. 15a, FIG. 16a is a cross-section view showing a state that the pusher 200, the inspective object carrier 300, the socket guide 400 and the socket assembly 500 are finally aligned in the inspection apparatus for the semiconductor device of FIG. 1.
Figure 15B:
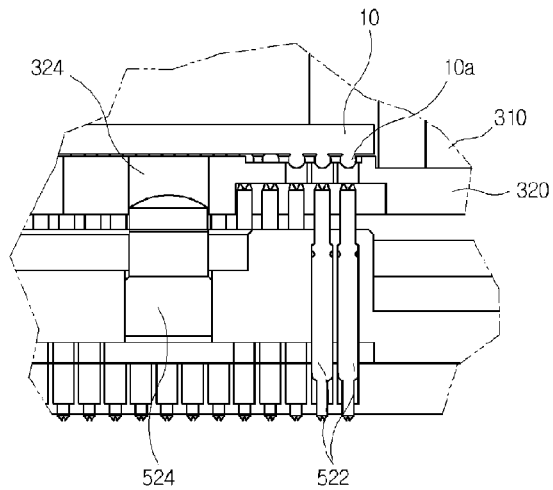

Then, if the inspective object carrier 300 completely couples with the socket guide 400, the guide projection 524 of the probe pin supporter 510 is initially fitted into the guide groove 324 of the floor member 320 of the inspective object carrier 300 as shown in FIGS. 15a and 15b, so that the ball terminal 10a of the semiconductor device 10 seated on the inspective object carrier 300 and the probe pin 522 of the socket assembly 500 can be secondarily aligned. At this time, the probe pin 522 of the socket assembly 500 is not inserted in the probe hole 322 of the floor member 320 of the inspective object carrier 300.

Figure 16A:
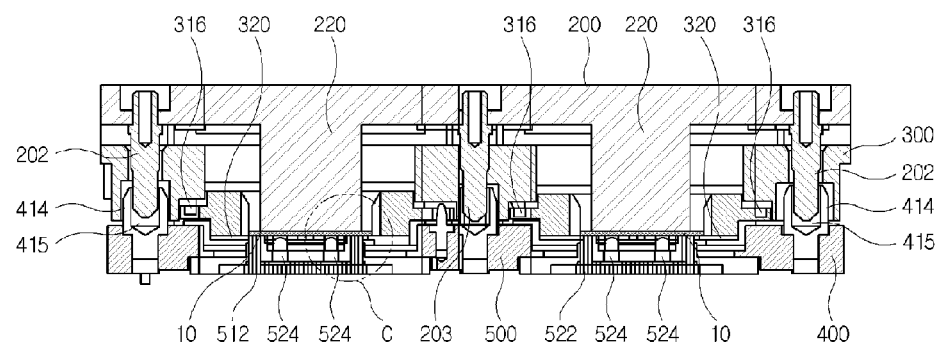
FIG. 16b is a partially enlarged cross-section view showing a 'C' part of FIG. 16a, and FIG. 17 is a cross-section view showing a conventional inspection apparatus for a semiconductor device.
Figure 16B:
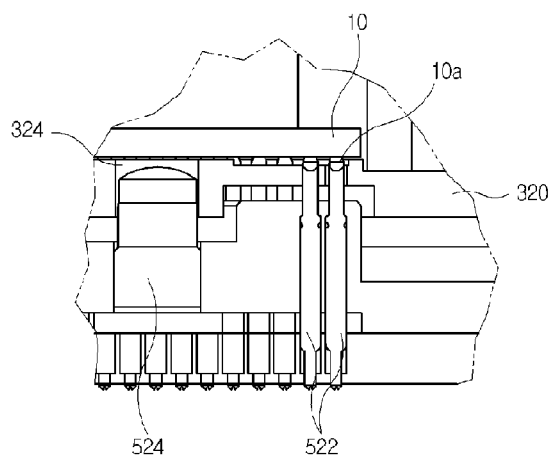
Figure 17:
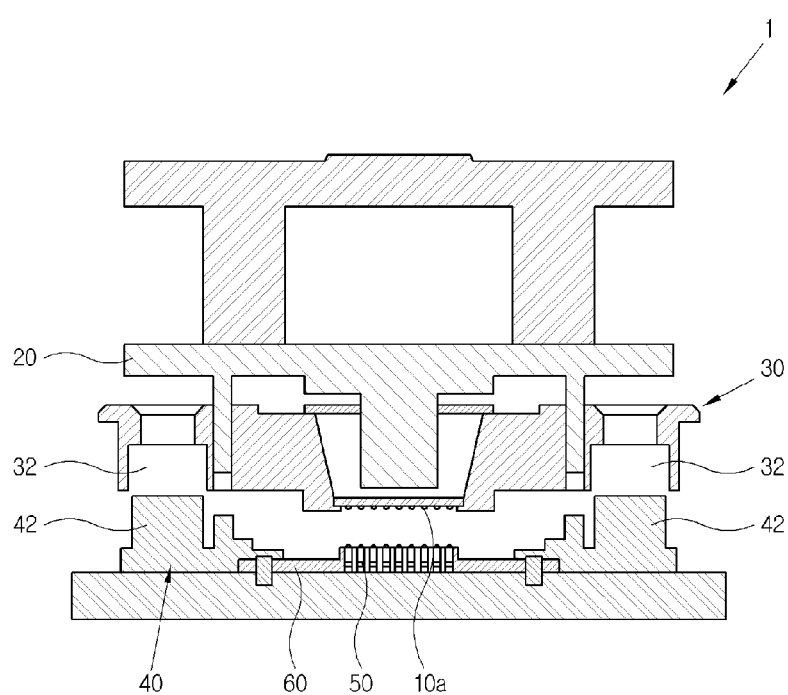

At last, if the pusher 200 is pressed for the test, the floating member 318 is pushed down by the elastic coupling portion 316 and thus the seated semiconductor device 10 is also moved down as shown in FIG. 16a, so that the ball terminal 10a of the semiconductor device 10 seated on the inspective object carrier 300 and the probe pin 522 of the socket assembly 500 can be tertiary-aligned. At this time, the guide projection 524 of the probe pin supporter 510 is completely inserted in the guide groove 324 of the floor member 320 of the inspective object carrier 300, and at the same time the probe pin 522 is inserted in the probe hole 322 of the floor member 320 as shown in FIG. 16b. As a result, the probe pin 522 inserted in the probe hole 322 is in contact with the ball terminal 10a of the semiconductor device As shown in FIGS. 15a and 15b, the guide projection 524 of the socket assembly 500 may be designed not to be inserted in the guide groove 524 of the inspective object carrier 300 when the inspective object carrier 300 is completely coupled to the socket guide 400. In this case, the guide projection 524 of the socket assembly 500 and the guide groove 324 of the inspective object carrier 300 are coupled when pushed by the pusher 200.

As described in the foregoing operations of the inspection apparatus for the semiconductor device, the ball terminal 10a of the inspective semiconductor 10 contacts the second end portion 525 of the probe pin 522 while at least partially inserted in the probe hole 322, thereby limiting the contact space between the second end portion 525 of the probe pin 522 and the ball terminal 10a to the inside of the probe hole 322. As a result, the ball terminal 10a of the semiconductor device 10 and the probe pin 522 of the socket assembly 500 not only precisely contact each other but also reduce the contact resistance.

Also, the coupling between the guide projection 524 and the guide groove 324 is prior to the coupling between the probe pin 522 and the probe hole 322, thereby inducing the precise coupling of the probe pin 522 to the probe hole 322, and protecting the minute probe pin 522 that is likely to be damaged by shock or crash.

To make such coupling between the guide projection 524 and the guide groove 324 be prior to the coupling between the probe hole 322 and the probe pin 522, the floor member 320 needs the protrusion accommodating portion 321 for accommodating the protrusion 514 of the probe pin supporter 510. Also, when the protrusion accommodating portion 321 accommodates the protrusion 514, they may not contact each other. When the protrusion 514 crashes the protrusion accommodating portion 321, the probe pin 522 may be changed in position, and thus damaged since the probe pin 522 is not exactly inserted in the probe hole 322.

In the inspection apparatus 100 according to the present invention, the opening 312 of the inspective object carrier 300 is not fully opened but blocked by the floor member 320, thereby preventing the inspective object 10 from falling, and preventing the tip portion of the probe pin 522 from being contaminated with foreign materials falling from the top of the inspective object carrier 300 during the test.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. An inspection apparatus for a semiconductor device, which is to inspect an electric characteristic of an inspective object having a plurality of electric inspective contact points, the inspection apparatus comprising:
    a socket assembly which comprises a plurality of probe pins retractable in a longitudinal direction, a probe pin supporter supporting the probe pins in parallel with each other, and a socket board comprising a plurality of fixed contact points a first end portion of the probe pins; and
    an inspective object carrier which comprises an inspective object accommodating portion accommodating the inspective object so that the plurality of inspective contact points face toward a second end portion of the plurality of probe pins, and a floor member interposing between the inspective object and the probe pin supporter and totally covering lower of the inspective object accommodating portion,
    wherein the floor member comprising comprises probe holes penetrated corresponding to the inspective contact points and passing the second end portion of the probe pin therethrough,
    wherein the floor member and the probe pin supporter comprise an alignment member to align the probe pins with probe holes,
    wherein upon testing, the probe pins are aligned with probe holes.

2. The inspection apparatus according to claim 1, wherein the alignment member comprise an embossed coupling portion which comprises a guide projection at one side and a guide groove at the other side to be coupled and aligned along a longitudinal direction of the probe pin.

3. The inspection apparatus according to claim 2, wherein the embossed coupling portion is formed so that in operation coupling between the guide projection and the guide groove occurs prior to coupling between the probe pin and the probe hole when the probe pin supporter approaches the floor member.

4. The inspection apparatus according to claim 1, wherein the probe hole accommodates at least a part of the inspective contact point along the longitudinal direction of the probe pin.

5. The inspection apparatus according to claim 3, wherein the probe pin supporter comprises a protrusion protruding toward the floor member in an area of the probe pin, and the floor member comprises a protrusion accommodating portion to accommodate the protrusion.

6. The inspection apparatus according to claim 5, wherein, when the guide projection and the guide groove are coupled, the protrusion is not in contact with the protrusion accommodating portion.

7. The inspection apparatus according to claim 2, wherein the embossed coupling portion comprises at least two pairs of one side guide projections and other side guide grooves, and the at least two pairs of guide projection and guide groove are different in shape.

8. The inspection apparatus according to claim 7, wherein the different shapes comprise a circular shape and an elliptical shape.

9. The inspection apparatus according to claim 1, wherein the floor member includes a dust discharging opening.

10. The inspection apparatus according to claim 1, wherein the floor member includes four guide grooves each configured with a different shape from one another.

* * * * *